United States Patent [19]

Deck

US005309277A

[11] Patent Number: 5,309,277
[45] Date of Patent: May 3, 1994

[54] HIGH INTENSITY ILLUMINATOR

[75] Inventor: Leslie L. Deck, Middletown, Conn.

[73] Assignee: Zygo Corporation, Middlefield, Conn.

[21] Appl. No.: 901,658

[22] Filed: Jun. 19, 1992

[51] Int. Cl.$^5$ .......... G02B 21/06; F21V 33/00
[52] U.S. Cl. ............. 359/387; 359/613; 359/656; 362/237; 362/252
[58] Field of Search ............ 359/385–390, 359/599, 707, 798, 19–20, 656, 599, 613; 362/227, 239–252, 382; 250/201.3; 351/247

[56] References Cited

U.S. PATENT DOCUMENTS

| | | | |
|---|---|---|---|
| 2,589,569 | 3/1952 | Peter et al. | 362/237 |
| 4,431,266 | 2/1984 | Mori et al. | 359/613 |
| 4,826,269 | 5/1989 | Streifer et al. | 359/19 |
| 4,852,985 | 8/1989 | Fujihara et al. | 359/387 |
| 4,893,223 | 1/1990 | Arnold | 362/252 |
| 5,038,258 | 8/1991 | Koch et al. | 359/656 |
| 5,106,183 | 4/1992 | Yoder, Jr. | 351/247 |

FOREIGN PATENT DOCUMENTS 252933  10/1989  Japan ................... 359/599

Primary Examiner—Loha Ben
Assistant Examiner—Thong Nguyen
Attorney, Agent, or Firm—Cohen, Pontani, Lieberman, Pavane

[57] ABSTRACT

The high intensity illuminator of the invention includes a mounting fixture, a receiving surface spaced from the mounting fixture, and a plurality of semiconductor illumination sources which are implemented, most preferably, by light emitting diodes or laser diodes. Each illumination source is operable for emitting an outwardly-diverging illumination cone along an axis of illumination of the source at a predetermined illumination wavelength. The plural illumination sources are mounted on the mounting fixture such that their illumination cones are overlappingly coincident on a selected portion of the receiving surface to provide at the receiving surface portion a highly uniform illumination of high intensity at the predetermined wavelength.

19 Claims, 6 Drawing Sheets

HIGH INTENSITY ILLUMINATOR

FIELD OF THE INVENTION

The present invention relates to precision optical metrology instrumentation and, more particularly, to illuminators for optical systems such, for example, as noncontact topographical surface profiling apparatus including interferometric microscopes.

BACKGROUND OF THE INVENTION

The need for high intensity, spatially uniform illumination sources is particularly acute in optical metrology instrumentation such, for example, as interferometric microscopes. In the past, sources of filtered and unfiltered white light and arc sources, gas lasers, laser diodes, and light emitting diodes (LED's)—each for the most part lifted, without significant modification or effective adaptation, from standard optical microscopes—have been employed. However, the acquisition of accurate measurement data using interferometric microscopes requires illuminator properties that notably differ from those suitable for standard optical microscopes.

For example, phase shifting interferometry instruments are routinely used in precision automated quality and process control applications in which data is repeatedly taken without direct operator intervention; the illumination source must accordingly be extremely rugged and long lived. Moreover, interferometric data is generally obtained using image sensors and, since the illumination wavelengths should be selected to conform to the spectral sensitivity and resolution requirements of the sensor, the ability of the human eye to image or view the illumination is generally irrelevant to wavelength selection.

Depending upon sensor type, interferometric illuminators may require shuttering during data readout and should therefore be 100 percent modulatable at relatively high speeds since, in typical applications, multiple frames of data are taken in synchronization with a reference surface phase shifter. In addition, the interference fringe contrast, rather than feature contrast, should be maximized and the fringes must have negligible contrast variation over the range of reference surface axial motion; accordingly, the temporal coherence length of the illumination should be long as compared to the reference surface axial motion.

Further requirements of interferometric microscope illumination are that its mean wavelength be precisely known, that its spectral properties and intensity not vary (i.e. high temporal uniformity) as data is being taken, that it be sufficiently intense as to reduce data acquisition time and, correspondingly, sensitivity to vibration, that its source not be a direct or indirect generator of measurement-disturbing vibrations, that it be spatially incoherent so as to reduce optical artifact sensitivity and speckle, and that it be sufficiently uniform as to provide a well understood spatial coherence function. It is also preferred that the illuminator provide ready access to a multiplicity of different wavelengths of light for extending the instrument's step measurement size.

All heretofore known and used illumination sources for optical metrology instrumentation fail to meet these multiple concurrent requirements. For example, filtered white light and arc sources satisfy the coherence requirements and are simple sources of multiple illumination wavelengths. However, they are short lived, are physically large with much associated optics, require mechanical shuttering and wavelength selection systems, and generate undue amounts of heat.

Gas laser sources satisfy the wavelength precision and stability requirements and are cooler and longer lived than incandescent sources. Moreover, unlike filtered white light or arc sources, the long temporal coherence properties of gas lasers permit their use with non-equal path (i.e. FIZEAU) type interferometers. On the other hand, they suffer from the need to reduce their spatial coherence, as by associated mechanical rotating diffuser disks which are both physically large and a potential source of vibration, they require mechanical shuttering systems, and they have no intrinsic wavelength selection capability. In addition, laser moding from thermally-induced cavity variations can be a major source of intensity fluctuations which are difficult to remove.

Laser diodes satisfy the wavelength precision requirement, are easily modulated, and are cooler in operation than arc, incandescent and gas laser sources and much longer lived. Moreover, the temporal coherence properties of index guided solid state lasers is comparable to gas lasers, and the intensity of laser diodes is sufficiently constant if their temperature is stabilized and optical feedback is provided. Although they have no intrinsic wavelength selection, the small size of laser diodes permits the use of multiple diodes for multiple wavelengths; however, the wavelengths vary from diode to diode and not all wavelengths, particularly short wavelengths, are available. Furthermore, laser diodes are high static sensitive and therefore require special handling precautions and circuitry and, as with gas lasers, they also suffer from laser moding and the need to break the spatial coherence as, for example, through the use of mechanical rotating diffuser disks.

Light emitting diode sources can potentially provide the advantage of long life, high speed modulation capability and low cost. Illuminators using LED's for standard microscopes, as for example described in U.S. Pat. No. 4,852,985, are not simultaneously of sufficient uniformity and intensity to provide a cost-effective source for automated precision optical metrology instrumentation. Imaging of a two-dimensional array of light emitting diodes onto a diffuse surface in an interferometric measurement apparatus requires high numerical aperture optics for good collection efficiency and results in a large, relatively expensive source with a sinusoidally-varying intensity distribution on the diffuser surface on which the semiconductors are imaged. Improvements to uniformity can be realized only at the cost of a thicker, more diffuse surface—which unavoidably and undesirably reduces illumination intensity. In addition, temporal intensity variations due to common mode electrical power fluctuations not visible to the eye can completely destroy interferometric data.

There is, accordingly, an unmet need for an illuminator that is especially well-suited for and concurrently satisfies the various requirements of automated precision optical metrology instrumentation, particularly for interferometric microscopes.

OBJECTS OF THE INVENTION

It is accordingly the desideratum of the present invention to provide an illuminator for use with optical metrology instrumentation, such as interferometric microscopes, that meets the various multiple aforementioned requirements of an illumination source for interferometric applications and the like. It is a particular object of the invention to provide such an illuminator that provides an intense illumination of high temporal and spatial uniformity at a known predetermined wavelength.

It is a further object of the invention to provide such an illuminator that is readily modulatable at high speeds to enable rapid synchronized measurement of multiple frames of data.

It is another object of the invention to provide such an illuminator that is capable of providing ready access to multiple different wavelengths of emitted illumination.

A still further object of the invention is to provide such an illuminator that is operable to effectively eliminate temporal intensity nonuniformities resulting from electrical power fluctuations and the like.

Yet another object of the invention is to provide such an illuminator that is inherently reliable, utilizes readily available component parts, and is relatively inexpensive to manufacture.

SUMMARY OF THE INVENTION

The illuminator of the present invention, as herein disclosed, is especially well-suited for use in association with interferometric microscopes although, as will become clear, its utility stretches well beyond that single utility. The inventive illuminator is intense and highly uniform, both temporally and spatially. It is readily modulatable at MegaHertz rates, thus providing fully-electronic shuttering. The mean wavelengths are well known and are easily stabilized, and multiple wavelengths are readily accessible. The illuminator has no moving parts and is compact, inexpensive to manufacture and use, generates little heat, is entirely solid state, and is extremely long lived. In addition, the illumination produced is spatially incoherent and has a short temporal coherence length.

In its basic form, the inventive illuminator includes a plurality of semiconductor illumination sources arranged or mounted on a mounting fixture, and a preferably diffuse receiving surface spaced from the fixture. The illumination sources are preferably light emitting diodes or laser diodes arranged as a closely-spaced array on the mounting fixture and oriented so that the illumination cones of the sources substantially overlap at a particular region or portion of the receiving surface. The mounting fixture may be formed as or include a spherically-contoured surface or member to which the illumination sources are mounted such that the illumination axes of the sources converge and meet at a common point spaced from the mounting fixture in the direction of the receiving surface, the receiving surface being located at the center of curvature of the spherical contour. A controller associated with or forming a part of the illuminator supplies operating electrical current and/or voltage to the sources for causing the sources to emit illumination cones at a common predetermined wavelength.

In another embodiment of the invention, semiconductor illumination sources of a multiplicity of different wavelengths are interspersed throughout all or part of the mounting fixture surface. The controller is operable for selectively energizing the various groups or sets of individual wavelength sources for changing the wavelength of illumination incident on the receiving surface portion.

A further modification of the invention provides a light pipe in the region between the mounting fixture and the receiving surface for enhancing illumination efficiency and spatial and temporal uniformity at the preferably diffuse receiving surface. The light pipe may advantageously be configured as a truncated cone, and where the light pipe is formed of a transparent material such as glass or polycarbonate, as is preferred, the exit surface of the light pipe can be ground and serve as the receiving surface.

In a still further modification, the illumination source-carrying surface or member of the mounting fixture is formed as a substantially flat plane, and the individual illumination sources are oriented so that their illumination cones substantially overlap at the desired portion or region of the receiving surface.

Another modification contemplates the provision of a feedback arrangement wherein a fractional part of the illumination incident on the receiving surface is sensed by a photodetector and is used to generate an electrical signal that is fed to the controller for adjusting the output of the illumination sources and thereby substantially improving temporal uniformity of the illumination at the receiving surface.

The mean wavelength of the illumination emitted by the inventive device may also be modified in accordance with the invention by varying the current supplied to the semiconductor light source elements, utilizing the known dependence in such semiconductor devices of wavelength to drive current. In this way small controlled wavelength shifts, useful in some applications of phase shifting interferometry, can be introduced.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims.

BRIEF DESCRIPTION OF THE DRAWINGS

In the drawings, wherein similar reference characters denote similar elements throughout the several views.

DETAILED DESCRIPTION OF THE PREFERRED EMBODIMENTS

Figure 1:
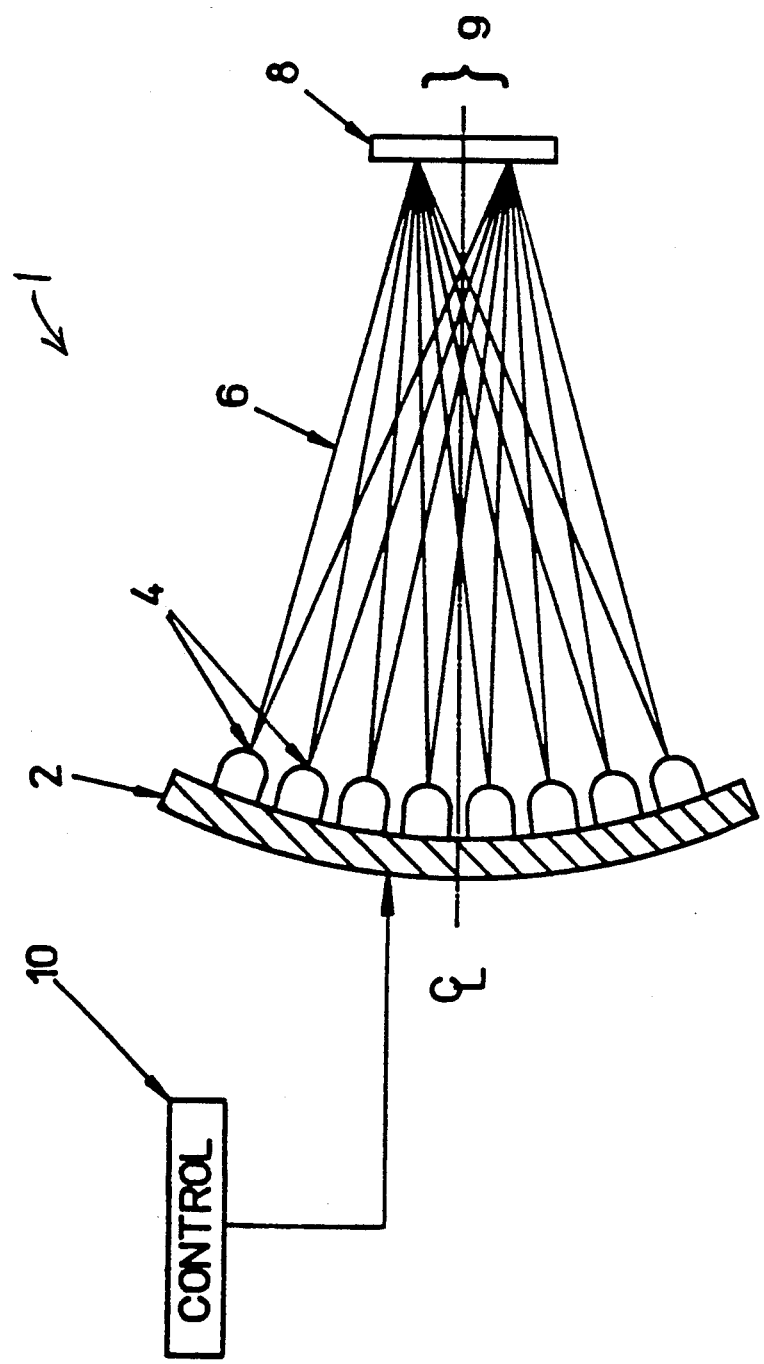
FIG. 1 is a cross-sectional, diagrammatic view of a first embodiment of an illuminator constructed in accordance with the teachings of the present invention.

An illuminator constructed in accordance with a first preferred embodiment of the invention is shown in FIG. 1 and is there designated by the general reference numeral 1. The illuminator 1, as hereinafter explained, is operable for emitting a highly uniform illumination at a predetermined wavelength and of relatively high intensity for use, in a most especially intended application, in association with or as a part of optical metrology instrumentation for topographical profiling such, by way of example, as an interferometric microscope. As seen in FIG. 1, the illuminator 1 includes a mounting fixture in the form of or providing a three-dimensional plate-like member or surface 2 having, in the arrangement herein disclosed, a concave, generally spherical or arcuate contour. A plurality of semiconductor illumination sources 4 are mounted to the fixture 2 and, more particularly, so as to operatively project or emit their respective illumination cones 6 outwardly from the concave face of the fixture in the direction of a preferably diffuse receiving surface 8 which is located in spaced relation to the fixture 2. That is, each of the illumination sources 4 is operable—as by passing an electrical current through and/or impressing an electrical potential across each source—to emit, along an illumination axis of the source 4, an illumination cone 6 of the source at a predetermined illumination wavelength which, in this first embodiment of the invention, is substantially the same wavelength for all of the sources 4. Moreover, the sources 4 are mounted to the fixture 2 such that the illumination cones 6 of the sources are overlappingly coincident on a selected region or portion 9 of the receiving surface 8 to provide at the receiving surface portion 9 a highly uniform illumination of high intensity at the predetermined wavelength. Thus, each point on the receiving surface portion 9 is illuminated approximately equally by each of the plural semiconductor illumination sources 4, as a consequence of which the illuminated area or region or portion 9 is extremely intense and highly uniform. The axes of emitted illumination of the plural sources 4 are furthermore directed to a common point spaced from the mounting fixture 2 in the direction of the receiving surface 8, preferably to a common point defined on the receiving surface 8 and most preferably to such a point defined on the receiving surface portion 9.

It is anticipated and generally contemplated that the semiconductor illumination sources 4 be implemented by conventional and commercially available light emitting diodes (LED's) and, most preferably, by superluminescent light emitting diodes such, by way of example and not limitation, as Hewlett Packard HLMP-8103 LED's. Nevertheless, the sources 4 may alternatively be implemented using known laser diodes. In any event, each of the plural illumination sources 4 is selected such that its center or mean peak output wavelength is or closely approximates the intended or selected predetermined wavelength of high intensity illumination to be produced by the illuminator 1. Toward this end, the plural illumination sources 4 of an illuminator 1 constructed in accordance with the present invention may all be of the same type. The predetermined illumination wavelength may, by way of example, be 660 nm or 650 nm.

The exact manner in which the plural illumination sources 4 are arranged on or about the mounting fixture 2 is substantially a matter of design choice. However, it is preferred and generally intended that the arrangement be such as to maximize the density, and thus the intensity, of the resulting illumination at the receiving surface portion 9. It is further contemplated, for this purpose, that the sources 4 be relatively closely packed together as, for example, to define a closely-spaced array of the plural illumination sources in which the sources may optionally be in substantial edge-to-edge abutment. As should be apparent, the suitability of any particular packing arrangement will be at least in part a function of the package type and configuration of the utilized sources 4.

The spacing or separation between the mounting fixture 2 and the receiving surface 8 is chosen to provide an illuminated region or portion 9 on the receiving surface 8 of the required or desired or intended size, generally an area smaller than that portion of the fixture 2 on which the plural illumination sources 4 are mounted. Where the mounting fixture 2 has a spherical surface contour or configuration, as in the FIG. 1 embodiment of the invention, the receiving surface 8 is preferably located at the center of curvature of the spherical surface. The preferably diffuse character of the receiving surface 8 provides improved uniformity of illumination by smoothing small irregularities in the far field patterns of the plural illumination sources 4.

The illuminator 1 may also include or be associated with an electronically-based or otherwise constructed controller 10. The controller is operable for supplying an operating electrical voltage or current signal to the plural semiconductor illumination sources 4 so as to cause the sources to emit the illumination cones 6 at the predetermined illumination wavelength. In a preferred form of the invention, the controller 10 is operable for supplying to the sources 4 an electrical signal that is predeterminately variable or periodic so as to modulate the illumination sources 4 between a first or "on" state in which the sources 4 emit their respective illumination cones 6 and a second, nonoperating or "off" state in which the sources do not emit such illumination beams. Put another way, the controller 10 is operable to vary, preferably at high speed, the electrical signals delivered to the illumination sources for causing the plural sources 4 to rapidly or otherwise switch between their "on" and "off" states, for example at a selected or predetermined or user-controllable frequency. It is generally contemplated that such modulation be effected concurrently for all of the plural sources 4, although embodiments in which less than all of the illumination sources are so modulated, or in which individual ones or groups of the plural sources 4 are modulated at the same rate(s) at staggered or respectively delayed times or intervals, or at different rates, are also within the intended scope of the invention. The design and construction of such a controller 10 in accordance with the operating characteristics herein described is considered to be well within the ordinary abilities of the person of ordinary skill in the art and the controller may be readily implemented in any of numerous ways as a general matter of design choice; descriptions of particular designs or constructions of the controller 10 are accordingly deemed unnecessary and, for brevity, are omitted.

Figure 2:
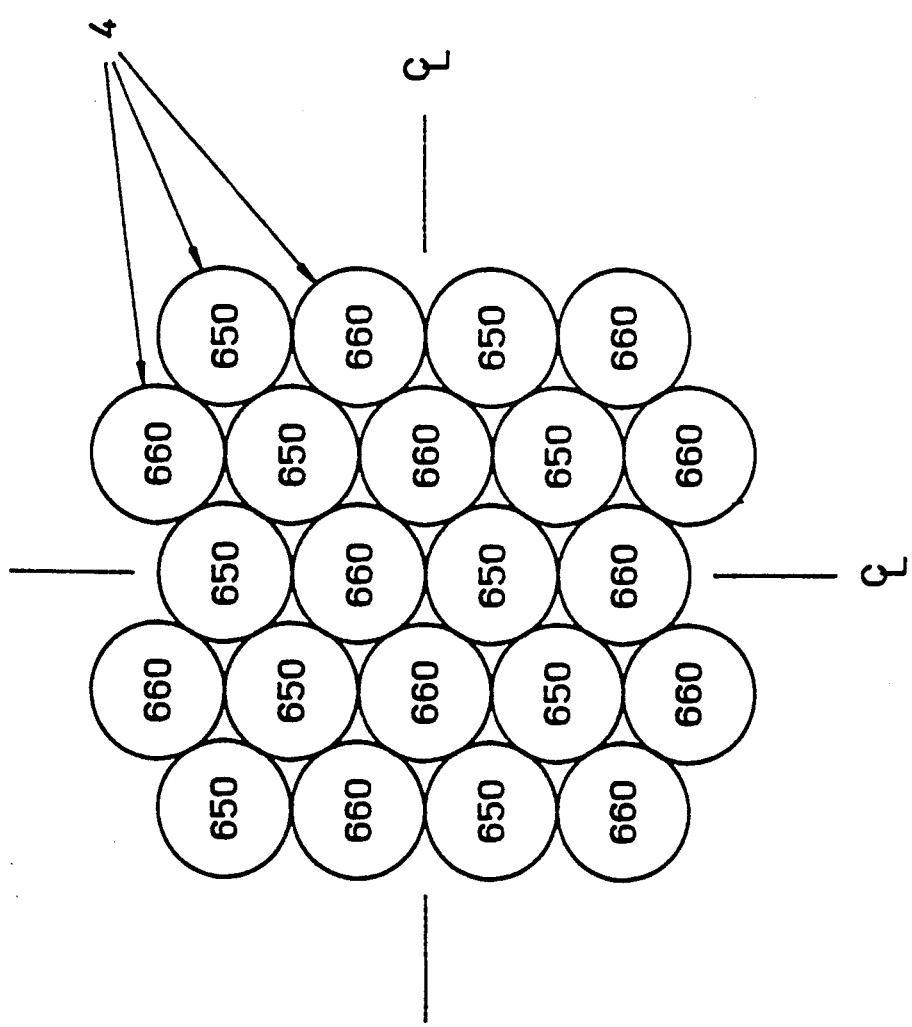
FIG. 2 is a front view of a mounting fixture in accordance with the invention and depicting one arrangement of illumination sources forming multiple wavelength sets of such sources.

In a first modification of the illuminator 1 of FIG. 1, the plural semiconductor illumination sources 4 are implemented as two (or more) pluralities of such sources 4, each such plurality having a different predetermined illumination wavelength. This modification results in an illuminator having multiple wavelength capability through selective energizing of only those elements of the desired wavelength required or appropriate for a particular imaging operation. One arrangement for suitably accommodating two sets or pluralities of illumination sources 4 on the mounting fixture 2 is shown, by way of example, in FIG. 2. The FIG. 2 arrangement accords with the aforementioned intention of maximizing the packing density of the sources 4 on the fixture 2 by providing a generally hexagonally-tiled array in which the illumination sources of the first and second groups or sets or pluralities are substantially alternated or intermixed in edge-to-edge abutment about the fixture surface. Nevertheless, numerous alternative and satisfactory packing or mounting arrangements of the illumination sources 4 may be employed for multiple wavelength illumination of the receiving surface portion 9. The two groups of sources 4 in FIG. 2 have, solely by way of example, respective emission wavelengths of 650 nm and 660 nm; the use of relatively closely-spaced emission wavelengths advantageously increases the achievable range of unambiguous measurement using an interferometric microscope, as is known to those skilled in the art.

Where the illumination sources 4 are grouped into two or more sets or subsets of different emission wavelengths, the controller 10 may in addition, or alternatively, be constructed and operable for separately modulating the individual sets or subsets of sources 4. For example, the controller may alternately operate or energize the individual sets or groups of illumination sources so that the high intensity illumination on the receiving surface portion 9 alternates between the predetermined wavelength of the first group of sources 4 and the predetermined wavelength of the second group of sources. Another of the various ways in which the controller 10 may modulate the multiple source groups is by varying the number or relative fraction of the sources 4 of each group that are concurrently illuminated or are illuminated at one or more selected modulation frequencies or periodicities, optionally permitting simultaneous illumination of sources 4 of different emission wavelength groups. Other modulation techniques and schemes will also be apparent to those skilled in the art given the teachings of this disclosure, particularly when viewed in the context of a particular contemplated application or utility.

Figure 3A:
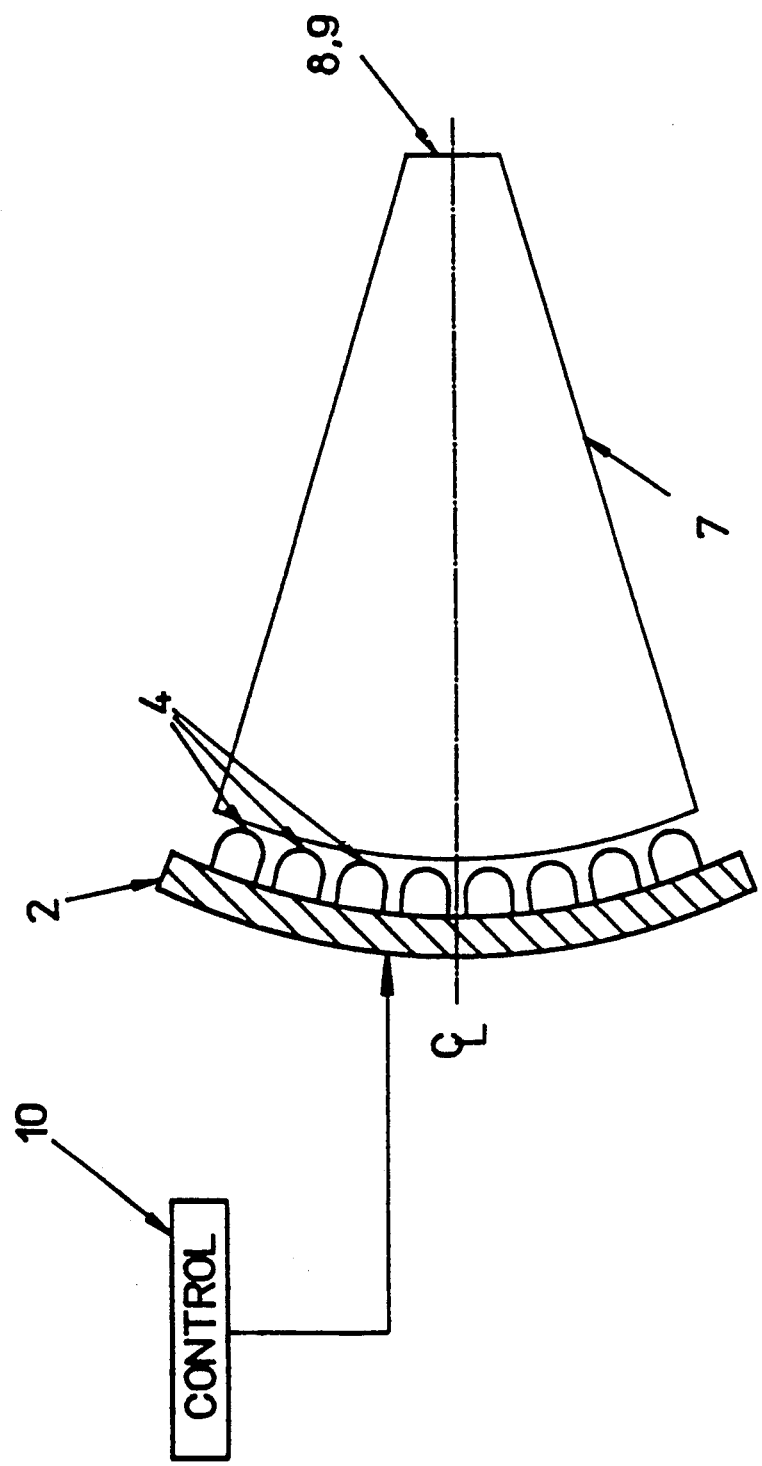
FIG. 3A is a cross-sectional, diagrammatic view of a modified form of the inventive illuminator of FIG. 1.

A further modification of the FIG. 1 embodiment of the invention—suitable for use with one or a plurality of groups or sets of illumination sources 4—is depicted in FIG. 3A. The illuminator of FIG. 3A more particularly further includes a light pipe 7 through which the illumination cones 6 of the sources 4 are directed. The light pipe is effective to increase the illumination intensity and to improve the spatial uniformity of the illuminated area or portion of the receiving surface and, although preferably transparent, may be fabricated and formed of any suitable material as a general matter of design choice. The pipe 7 extends from a first or input or entry face at one end disposed proximate, preferably closely proximate, the fixture-mounted illumination sources 4 and terminates at an output end spaced from the mounting fixture. Thus, the illumination source cones 6 enter the light pipe through its entry face which, in the FIG. 3A embodiment, has a spherical contour complementary to the source-carrying spherical surface of the fixture 2, and move through and along the pipe 7 to its output end. The output or exit end of the light pipe 7 has a substantially flat planar face that here serves as and defines the receiving surface 8, although alternate implementations in which a separate receiving surface is provided in suitable proximity to the light pipe output end face are also contemplated. The output end face may, in addition, be advantageously diffuse as is preferred in respect of the discrete receiving surface 8 of FIG. 1 so as to provide improved uniformity of the resulting illumination. Toward this end, the light pipe may be formed of a transparent material such as glass or polycarbonate and the exit surface ground to provide the desired degree of diffusion. In the illustrated FIG. 3A embodiment, and as will be appreciated, the illuminated portion 9 comprises the entirety of the receiving surface 8 that is defined by the exit face of the light pipe.

Figure 3B:
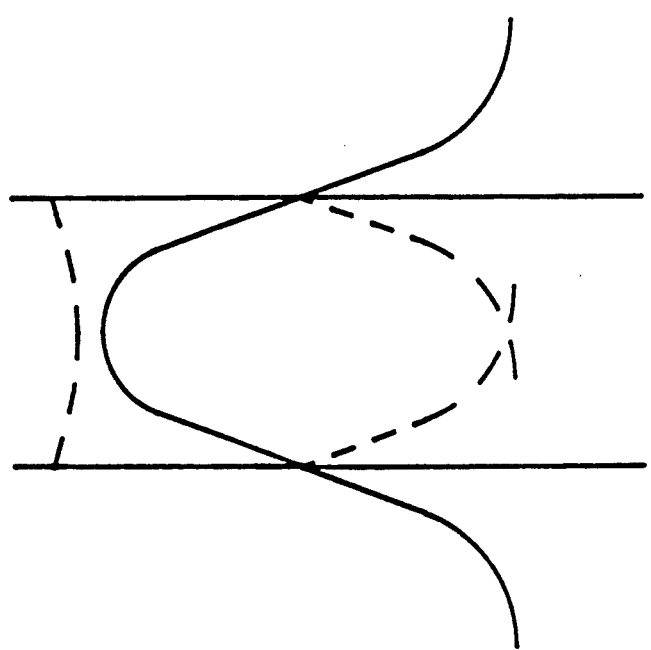
FIG. 3B is a graph associated with the embodiment of the inventive illuminator shown in FIG. 3A and depicting a received illumination amplitude distribution in accordance with the invention.

The light pipe 7 of FIG. 3A has a decreasing or converging width or circumference from its input end to its output end and, as seen in the drawing, is of generally frustoconical configuration in the illustrated embodiment. Light from the sources 4 that otherwise would or may have escaped the illumination cones 6 due to an unnecessarily large divergence angle is captured by the light pipe and redirected to the desired illumination portion or area 9 on the receiving surface 8. In effect, improved spatial uniformity in the receiving surface illumination is obtained by "folding back" the tails of the semiconductor light source far field distributions, as illustrated in FIG. 3B. That is, in order to assure substantial uniformity in the incident illumination across the illuminated portion 9 of the receiving surface 8 in the absence of the light pipe 7, a certain amount of illumination from the sources 4 will fall outside of the portion 9. With the light pipe present, the "tails" of the emitted illumination from the sources 4 are added to the central light distribution patterns or cones of the sources, thereby enhancing the illumination uniformity on and throughout the receiving surface portion 9.

Figure 4:
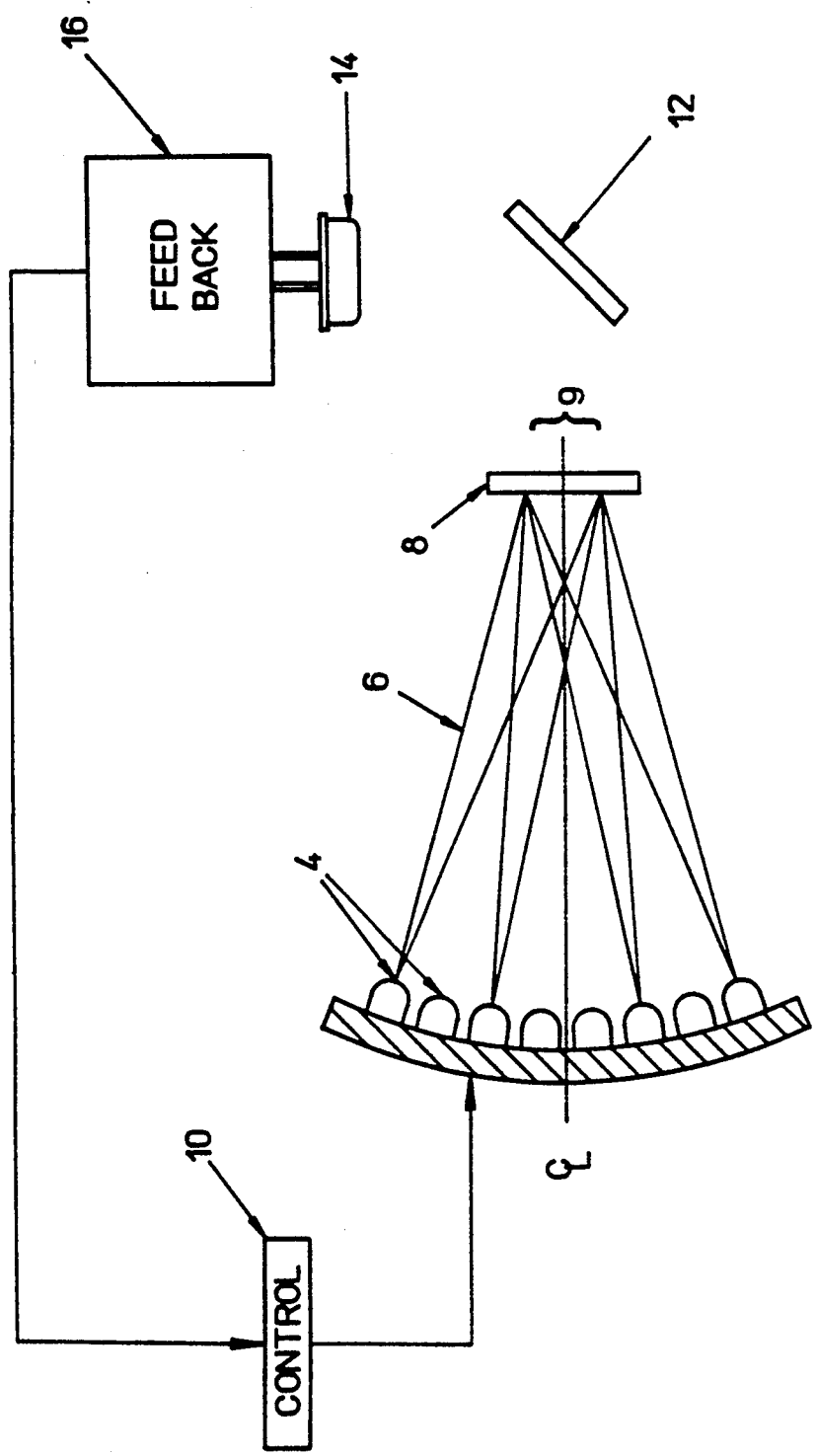
FIG. 4 is a cross-sectional, diagrammatic view of a further modified form of the inventive illuminator of FIG. 1.

Although the substantially equal overlapping of the far field distributions of the illumination sources 4 is effective to improve temporal uniformity by reducing non-common mode light fluctuations, common mode variations due to, for example, electrical power fluctuations and the like will still be present in the illuminated portion 9 of the receiving surface. A further modification of the inventive illuminator for accommodating and correcting for such common mode variations—with or in the absence of a light pipe 7—is shown in FIG. 4 wherein the light pipe is, for ease of discussion, omitted. This additional modification relies on a recognition that semiconductor light sources, such as superluminescent light emitting diodes and laser diodes, have extremely fast response times and will translate almost any drive current variations into corresponding changes in their emitted illumination output. The FIG. 4 embodiment thus effectively eliminates temporal intensity nonuniformities due to common mode variations through the use of optical feedback. In this modified operating arrangement of the FIG. 1 illuminator 1, a small portion or fraction of the light from the receiving surface portion 9 is redirected, as with a beamsplitter such as the plane beamsplitter 12, onto a photosensitive cell or detector 14 such as a conventional photodiode having suitable sensitivity to the predetermined wavelength(s) emitted by the illumination sources 4. The signal from the cell or detector 14, after optional signal conditioning or preprocessing at 16, is directed to the controller 10 which automatically and dynamically corrects for illumination output variations that are sensed by the detector 14 by correspondingly adjusting, in any known or appropriate manner, the drive current and/or operating voltage fed to the illumination sources 4 in accordance with the feedback signal.

Figure 5:
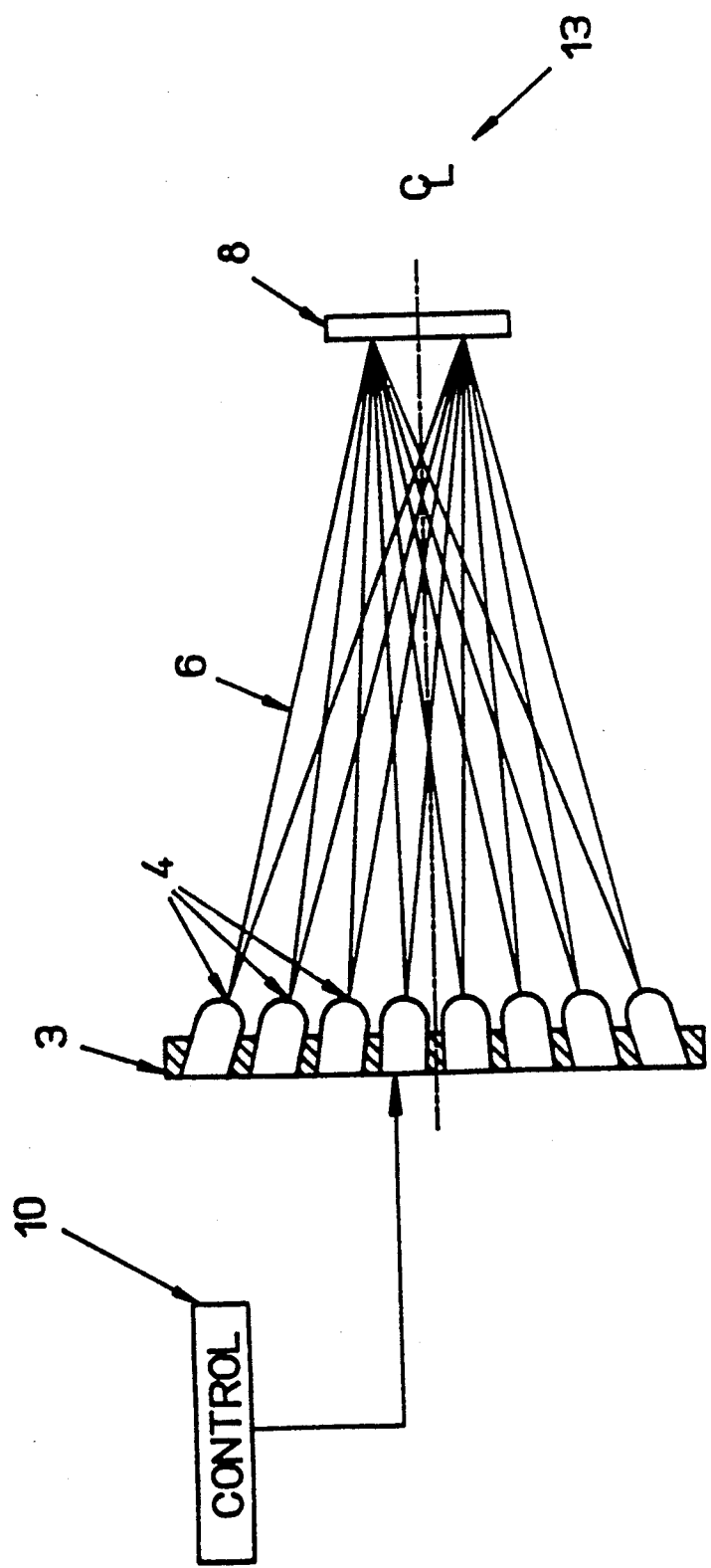
FIG. 5 is a cross-sectional, diagrammatic view of still another embodiment of the inventive illuminator.

A still further modification of the inventive illuminator is depicted in FIG. 5. In those embodiments of the illuminator thus far shown and described, the illumination sources 4 are mounted to a mounting fixture member or surface having a spherical or arcuate or otherwise curved contour. Such surface contours permit the semiconductor illumination sources 4 to be mounted directly on or to such curved surface whereby their illumination axes 6—each extending substantially normal to the supporting surface at the location of its respective source 4—are directed toward a common point spaced outwardly from the fixture 2 in the direction of the receiving surface 8. In the FIG. 5 embodiment, on the other hand, the mounting surface or member is in the form of a substantially flat or two-dimensional plane and each illumination source 4 is mounted on or to or with respect to the flat fixture surface at an individually-predetermined orientation selected so that the plural illumination axes of the sources 4 extend toward such an outwardly-spaced common point. Put another way, each source 4 is mounted so as to, in effect, simulate a spherically or arcuately-curved mounting or support surface so that the illumination cones 6 of the plural sources 4 overlap on the receiving surface 8 and are substantially coincident at the portion 9. Thus, with the exception of any illumination source that may be located at the exact optical centerline $C_l$ of the illuminator, each of the sources 4 in the FIG. 5 embodiment will be mounted—i.e. their illumination axes will extend outwardly—at a non-normal angle to that surface. It will be recognized that where the plural sources 4 have the same divergence angle of emitted illumination, this arrangement will exhibit slightly diminished spatial uniformity in the illumination incident on the receiving surface portion 9 because the illuminated area attributable to each source at the receiving surface 8 will vary as a function of distance from the optical centerline $C_L$. Compensation for this effect may optionally be provided through the use of refractive optics or filters or by any other suitable arrangements or means as general matters of design choice. It should also be pointed out that the modification of FIG. 5 may be incorporated in any of the aforedescribed embodiments of the inventive illuminator, or used in association with other individual elements of those embodiments as deemed necessary or appropriate for particular intended applications of the present invention.

Thus, while there have been shown and described and pointed out fundamental novel features of the invention as applied to various preferred embodiments thereof, it will be understood that various omissions and substitutions and changes in the form and details of the devices illustrated, and in their operation, may be made by those skilled in the art without departing from the spirit of the invention. It is the intention, therefore, to be limited only as indicated by the scope of the claims appended hereto.

What is claimed is:

1. A high intensity illuminator comprising:
   a mounting fixture;
   a receiving surface spaced from said mounting fixture;
   a plurality of semiconductor illumination sources, each said illumination source being operable for emitting an outwardly-diverging illumination cone along an axis of illumination of said each source at a predetermined illumination wavelength; said plural illumination sources being mounted on said mounting fixture such that said illumination cones of said sources are overlappingly coincident on a selected portion of said receiving surface to provide at said receiving surface portion a highly uniform illumination of high intensity at said predetermined wavelength; and
   a light pipe extending from an input end and terminating at an output end having a surface defining said receiving surface, said light pipe being disposed relative to said mounting fixture so that the illumination cones of said plural illumination sources enter said light pipe at said input end and are directed by said light pipe along said pipe and onto said light pipe output end.

2. A high intensity illuminator in accordance with claim 1, wherein said light pipe outlet end comprises a diffuse surface for smoothing intensity irregularities in the illumination impinging on said receiving surface portion from said plural illumination sources.

3. A high intensity illuminator in accordance with claim 1, wherein said light pipe comprises a frustoconically-converging light pipe for concentrating said illumination source illumination cones on said receiving surface.

4. A high intensity illuminator in accordance with claim 1, said light pipe having an outer configuration of decreasing circumference from said input end to said outlet end.

5. A high intensity illuminator comprising:
   a mounting fixture;
   a receiving surface spaced from said mounting fixture; and
   a plurality of semiconductor illumination sources, each said illumination source being operable for emitting an outwardly-diverging illumination cone along an axis of illumination of said each source at a predetermined illumination wavelength; said plural illumination sources being mounted on said mounting fixture such that said illumination cones of said sources are overlappingly coincident on a selected portion of said receiving surface to provide at said receiving surface portion a highly uniform illumination of high intensity at said predetermined wavelength;
   wherein said plural illumination sources comprise a first plurality of semiconductor illumination sources and said predetermined illumination wavelength comprises a first predetermined illumination wavelength, further comprising a second plurality of semiconductor illumination sources, each said illumination source of said second plurality being operable for emitting an outwardly-diverging illumination cone along an axis of illumination of said each source at a second predetermined illumination wavelength; said second plural illumination sources being mounted on said mounting fixture such that said illumination cones of said second sources are overlappingly coincident on said selected portion of said receiving surface to provide at said receiving surface portion a highly uniform illumination of high intensity at said second predetermined wavelength.

6. A high intensity illuminator in accordance with claim 5, wherein said first and said second pluralities of illumination sources are mounted on said mounting fixture in a substantially alternating array of illumination sources of said respective first and second pluralities.

7. A high intensity illuminator in accordance with claim 5, further comprising means for selectively modulating said first and second plural illumination sources between a first operating condition in which illumination sources of said first plurality emit said illumination cones at said first predetermined wavelength and a second operating condition in which illumination sources of said second plurality emit said illumination cones at said second predetermined wavelength.

8. A high intensity illuminator in accordance with claim 5, further comprising means for selectively modulating said first and second plural illumination sources between a first operating condition in which only illumination sources of said first plurality are operated to emit said illumination cones and a second operating condition in which only illumination sources of said second plurality emit said illumination cones so as to vary said high intensity illumination at said receiving surface between said first and second predetermined wavelengths.

9. A high intensity illuminator in accordance with claim 5, further comprising means for selectively modulating said illumination sources of said first and second pluralities of sources between an operating condition in which at least some of the sources of said first and second pluralities of illumination sources emit said illumination cones and a nonoperating condition of said at least some sources.

10. A high intensity illuminator in accordance with claim 9 wherein said means for selectively modulating said illumination sources comprises means for supplying an electrical signal to said plural illumination sources for operating said sources to emit said illumination cones, further comprising means for sensing an illumination intensity at said receiving surface portion, said sensing means being connected to said supplying means and said supplying means further comprising means for varying the electrical signal supplied to said first and second pluralities of illumination sources in compensating accordance with illumination intensity variations sensed by said sensing means so as to provide a substantially constant illumination intensity at said receiving surface portion.

11. A high intensity illuminator in accordance with claim 10, further comprising a light pipe extending from an input end and terminating at an output end having a surface defining said receiving surface, said light pipe being disposed relative to said mounting fixture so that the illumination cones of said first and second pluralities of illumination sources enter said light pipe at said input end and are directed by said light pipe along said pipe and onto said light pipe output end.

12. A high intensity illuminator comprising:
a mounting fixture;
a receiving surface spaced from said mounting fixture;
a plurality of semiconductor illumination sources, each said illumination source being operable for emitting an outwardly-diverging illumination cone along an axis of illumination of said each source at a predetermined illumination wavelength; said plural illumination sources being mounted on said mounting fixture such that said illumination cones of said sources are overlappingly coincident on a selected portion of said receiving surface to provide at said receiving surface portion a highly uniform illumination of high intensity at said predetermined wavelength;

means for supplying an electrical signal to said plural illumination sources for operating said sources to emit said illumination cones; and means for sensing an illumination intensity at said receiving surface portion, said sensing means being connected to said supplying means and said supplying means further comprising means for varying the electrical signal supplied to said plural illumination sources in compensating accordance with illumination intensity variations sensed by said sensing means so as to provide a substantially constant illumination intensity at said receiving surface portion.

13. A high intensity illuminator in accordance with claim 12, further comprising means for directing a portion of the illumination at said receiving surface portion to said sensing means.

14. A high intensity illuminator in accordance with claim 13, wherein said directing means comprises a beamsplitter.

15. A high intensity illuminator comprising:
a mounting fixture;
a receiving surface spaced from said mounting fixture;
a plurality of semiconductor illumination sources, each said illumination source being operable for emitting an outwardly-diverging illumination cone along an axis of illumination of said each source at a predetermined illumination wavelength; said plural illumination sources being mounted on said mounting fixture such that said illumination cones of said sources are overlappingly coincident on a selected portion of said receiving surface to provide at said receiving surface portion a highly uniform illumination of high intensity at said predetermined wavelength;

means for supplying an electrical signal to said plural illumination sources for operating said sources to emit said illumination cones, said supplying means further comprising means for selectively modulating said illumination sources between an operating condition in which the sources emit said illumination cones and a nonoperating condition; and means for sensing an illumination intensity at said receiving surface portion, said sensing means being connected to said supplying means and said supplying means further comprising means for varying the electrical signal supplied to said plural illumination sources in compensating accordance with illumination intensity variations sensed by said sensing means so as to provide a substantially constant illumination intensity at said receiving surface portion.

16. A high intensity illuminator in accordance with claim 15, further comprising a light pipe extending from an input end terminating at an output end having a surface defining said receiving surface, said light pipe being disposed relative to said mounting fixture so that the illumination cones of said plural illumination sources enter said light pipe at said input end are directed by said light pipe along said pipe and onto said light pipe output end.

17. A high intensity illuminator comprising;
a mounting fixture;

a diffuse surface spaced from said mounting fixture;

a plurality of semiconductor illumination sources, each said illumination source comprising a light emitting diode operable for emitting an outwardly-diverging illumination cone along an axis of illumination of said each source at a predetermined illumination wavelength; said plural illumination sources being mounted on said mounting fixture such that said illumination cones of said sources are overlappingly coincident on a selected portion of said diffuse surface to provide at said diffuse surface portion a highly uniform illumination of high intensity at said predetermined wavelength;

means for supplying an electrical signal to said plural illumination sources for operating said sources to emit said illumination cones; and means for sensing an illumination intensity as said diffuse surface portion, said sensing means being connected to said supplying means and said supplying means further comprising means for varying the electrical signal supplied to said plural illumination sources in compensation accordance with illumination intensity variations sensed by said sensing means so as to provide a substantially constant illumination intensity at said receiving surface portion.

18. A high intensity illuminator comprising:

a mounting fixture;

a diffuse surface spaced from said mounting fixture;

a plurality of semiconductor illumination sources, each said illumination source comprising a light emitting diode operable for emitting an outwardly-diverging illumination cone along an axis of illumination of said each source at a predetermined illumination wavelength; said plural illumination sources being mounted on said mounting fixture such that said illumination cones of said sources are overlapping coincident on a selected portion of said diffuse surface to provide at said diffuse surface portion a highly uniform illumination of high intensity at said predetermined wavelength;

means for supplying an electrical signal to said plural illumination sources for operating said sources to emit said illumination cones, said supplying means further comprising means for selectively modulating said illumination sources between an operating condition in which the sources emit said illumination cones and a nonoperating condition; and means for sensing an illumination intensity at said diffuse surface portion, said sensing means being connected to said supplying means and said supplying means further comprising means for varying the electrical signal supplied to said plural illumination sources in compensating accordance with the illumination intensity variations sensed by said sensing means so as to provide a substantially constant illumination intensity at said diffuse surface portion.

19. A high intensity illuminator in accordance with claim 18, further comprising a light pipe extending from an input end and terminating at an output end having a surface defining said diffuse surface, said light pipe being disposed relative to said mounting fixture so that the illumination cones of said plural illumination sources enter said light pipe at said input end and are directed by said light pipe along said pipe and onto said light pipe output end.

* * * * *